United States Patent
Okamoto et al.

(10) Patent No.: US 6,906,610 B1
(45) Date of Patent: Jun. 14, 2005

(54) INDUCTOR ELEMENT

(75) Inventors: Akira Okamoto, Ageo (JP); Takeshi Ikeda, Tokyo (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/018,606

(22) PCT Filed: Jul. 6, 2000

(86) PCT No.: PCT/JP00/04493

§ 371 (c)(1),
(2), (4) Date: Dec. 17, 2001

(87) PCT Pub. No.: WO01/04918

PCT Pub. Date: Jan. 18, 2001

(30) Foreign Application Priority Data

Jul. 7, 1999 (JP) .......................... 11-192675

(51) Int. Cl.[7] .............................. H01F 5/00
(52) U.S. Cl. .................. 336/200; 336/232; 336/223
(58) Field of Search .................. 336/200, 223, 336/232, 83

(56) References Cited

U.S. PATENT DOCUMENTS

| | | | |
|---|---|---|---|
| 5,461,353 A | * 10/1995 | Eberhardt | .................... 333/246 |
| 5,583,474 A | * 12/1996 | Mizoguchi et al. | ............ 336/83 |
| 6,144,269 A | * 11/2000 | Okamoto et al. | ............ 333/184 |
| 6,501,363 B1 | * 12/2002 | Hwu et al. | ................... 336/200 |

FOREIGN PATENT DOCUMENTS

| | | |
|---|---|---|
| EP | 0643402 A2 * | 8/1990 |
| EP | 0 643 402 | 3/1995 |
| JP | 06-302443 | 10/1994 |
| JP | 10-74624 | 3/1998 |
| JP | 10-208940 | 8/1998 |

OTHER PUBLICATIONS

Patent Abstracts of Japan, vol. 1998, No. 13 Nov. 30, 1998, JP–A–10208940 (Abstract) Aug. 7, 1998.
Patent Abstracts of Japan, vol. 1995, No. 01 Feb. 28, 1995, JP–A–06302443 (Abstract) Oct. 28, 1994.
Patent Abstracts of Japan, vol. 011, No. 309 (E–547) Oct. 8, 1987, JP–A–62104013 (Abstract) May 14, 1987.

* cited by examiner

*Primary Examiner*—Lincoln Donovan
*Assistant Examiner*—Jennifer A. Poker
(74) *Attorney, Agent, or Firm*—Dellett & Walters

(57) ABSTRACT

An inductor element 100 capable of functioning properly on a substrate includes two similarly shaped conductors such as spiral conductors 120, 122 formed on the surface of a semiconductor substrate 110. The upper conductor 120 and the lower conductor 122 have substantially the same shape, and the inner end of the conductor 120 is connected electrically with the outer end of the conductor 122. The outer and inner ends of the conductor 120 are connected with lead wires 130, 132, respectively, and the lead wire 132 connected to the inner end is led between the lower conductor 122 and the semiconductor substrate 110 to the periphery of the substrate.

25 Claims, 14 Drawing Sheets

F/G. 12

F I G. 14
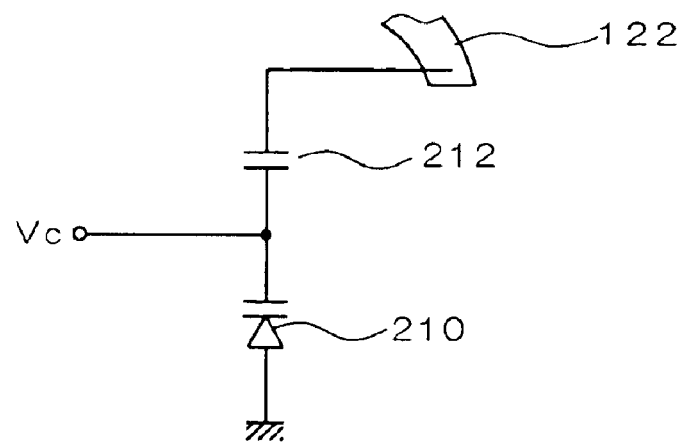
F I G. 15
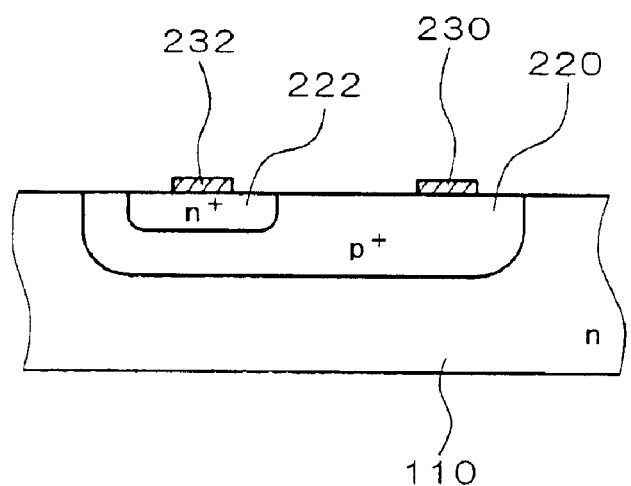
F I G. 16
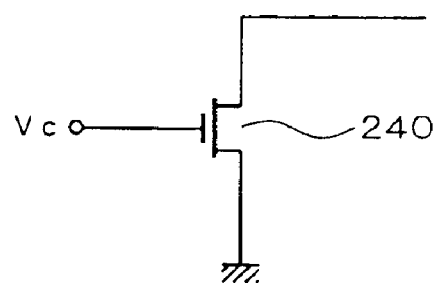

F/G. 17
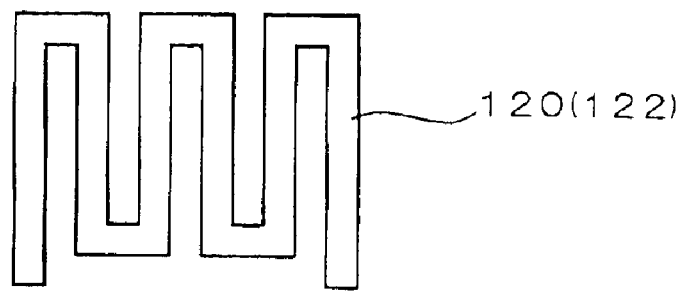
F/G. 18
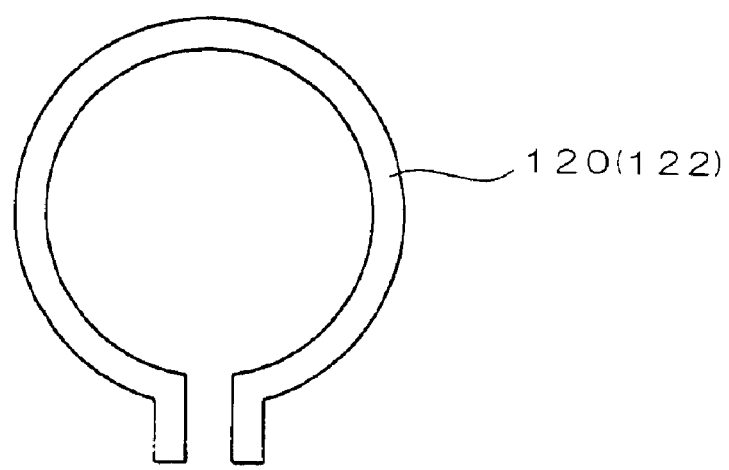
F/G. 19
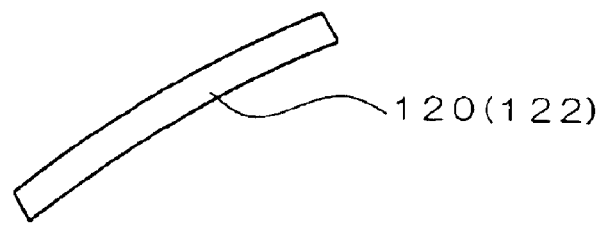

INDUCTOR ELEMENT

TECHNICAL FIELD

The present invention relates to an inductor element that is formed on various kinds of substrates such as a semiconductor substrate.

BACKGROUND ART

There is known such a semiconductor circuit that forms a spiral pattern electrode on a semiconductor substrate with using thin film forming technique and uses this pattern electrode as an inductor element. If current flows in such an inductor element that is formed on such a semiconductor substrate, magnetic flux is generated in the direction perpendicular to the spiral pattern electrode. Nevertheless, since eddy currents are induced on the front side of the semiconductor substrate by this magnetic flux to cancel effective magnetic flux, there is a problem of not effectively functioning as the inductor element. In particular, the higher a frequency of a signal that flows in the inductor element becomes, the more remarkable this inclination becomes, and hence it is difficult to form a high-frequency circuit, containing an inductor element, on a semiconductor substrate.

DISCLOSURE OF THE INVENTION

The present invention has been developed to solve the above mentioned problems, and its object is to provide an inductor element that effectively functions even if the inductor element is formed on a substrate.

An inductor element of the present invention has two conductors that are formed in piles on a substrate in the state where they are mutually insulated, and are connected with each other at both odd ends. While one conductor separating from the substrate is used as an inductor conductor, a lead wire of this inductor conductor is led out through a gap between another conductor, being near the substrate, and the substrate. When two conductors that are mutually connected at both odd ends are located in piles on a substrate and one of the conductors apart from the substrate is used as an inductor conductor, it has been verified in experiments that predetermined inductance is kept without an inductance component disappearing by eddy currents etc. even if this inductor conductor is formed on the substrate. In particular, by leading out the lead wire of this inductor conductor from between another conductor and the substrate, it becomes possible to preventing the flow of the effective magnetic flux, generated by the inductor conductor, to the minimum from being interrupted. Hence good characteristics can be obtained.

In particular, it is desirable to form three or more layers of metal layers on the substrate described above, and to form the two conductors described above and lead wires respectively with using different metal layers which are mutually apart by one or more layers. Since the inductor conductor can be made to be apart from the lead wires by at least two or more layers by adopting such constitution, it is possible to further reduce the influence of the electric current that flows in the lead wires.

In addition, it is desirable to connect the two conductors at both odd ends with using a part of a lead wire of the inductor conductor extending from the one end of the inductor conductor. Since the number of the conducting wires (lead wires and connecting wires) that intersect the inductor conductor can be reduced, a degree of interrupting the flow of the effective magnetic flux generated by the inductor conductor can be further reduced. In addition, since the shape of a mask can be simplified when manufacturing each conductor and lead wires with using an aligner etc., it is possible to reduce a manufacturing cost and manufacturing labor hours.

Furthermore, an inductor element of the present invention has two conductors that are formed in piles on a substrate in the state where they are mutually insulated, and are connected with each other at both odd ends. While using one conductor apart from the substrate as an inductor conductor, one end of another conductor not connected to the inductor conductor is terminated with a predetermined impedance element. Although electric current flows also in another conductor by the effective magnetic flux generated by the inductor conductor, it becomes possible to prevent unnecessary reflection in this portion and to improve characteristics by terminating the end of the free side of another conductor with the impedance element. In addition, it is possible to adjust frequency characteristics or the like of another conductor by forming the impedance element with using any of a resistor, a capacitor, and an inductor or combining these. Hence it becomes possible also to improve characteristics by adjusting a device constant of the impedance element at a suitable value.

In addition, it is desirable to adjust termination conditions by making it possible to change at least one device constant of a resistor, a capacitor, and an inductor, which constitute the impedance element described above, and making this device constant variable. By some external means, for example, by changing a value of a control voltage applied, it becomes possible to adjust a device constant of the whole impedance element, that is, characteristics of the inductor element by a change of termination conditions.

In particular, when the substrate described above is a semiconductor substrate, it is desirable to form the capacitor where a device constant can be changed by a variable capacitance diode. While it becomes possible to miniaturize parts by using the variable capacitance diode formed with using the semiconductor substrate, it becomes possible to reduce a manufacturing cost by simplifying manufacturing process in comparison with the case where external parts are attached thereafter, and wiring etc. are performed. Similarly, when the substrate described above is a semiconductor substrate, it is desirable to form a variable resistor made of an FET whose channel is used as a resistor. While it is possible to miniaturize parts by using the variable resistor made of the FET formed with using the semiconductor substrate, it becomes possible to reduce a manufacturing cost by simplifying manufacturing process in comparison with the case where external parts are attached thereafter, and wiring etc. are performed.

In addition, it is desirable to form an inductor, which constitutes the impedance element, by a conductive layer formed on the substrate in predetermined shape. Since high Q is not required of the inductor used for terminating one end of a conductor, it is possible to realize the inductor with a conductor pattern on the substrate. Moreover, since it becomes possible to form this conductor pattern at the same process with using a metal layer for performing various kinds of wiring etc., it becomes possible to perform miniaturization of parts, simplification of process, and cost reduction.

In addition, it is desirable to form two conductors, described above, in the approximately same shape or long shape. Since an upper conductor never directly faces the front side of the substrate owing to making the two conductors the same in shapes, it is possible to reduce the eddy currents that are generated on the substrate when the upper conductor directly faces the substrate. In addition, it is possible to give predetermined inductance to the upper conductor by making the shapes of the two conductors be long. In particular, since it is possible to give large inductance to a conductor when the conductor is formed in one or more turns of spiral shape or a meander shape, the conductor is suitable for being built in a comparatively low frequency circuit. In addition, since it is possible to give a small inductance to a conductor when the conductor is formed in a circular shape less than one turn or an substantially linear shape in comparison with the case where the conductor is formed in a spiral shape or the like, the conductor is suitable for being built in a comparatively high frequency circuit.

Moreover, when two conductors are made in spiral shapes, it is preferable to connect an inner end of one conductor with an outer end of another conductor. Since it is experimentally confirmed that it is possible to secure further large inductance when an inductor conductor is formed on a substrate owing to performing such connection, it is possible to realize the inductor element that effectively functions on a substrate. In particular, when the shape is a spiral one having one or more turns, it is necessary to extend a lead wire from the inner circumferential end of the inductor conductor having this spiral shape. Nevertheless, it is possible to suppress to the minimum the interruption of flow of the effective magnetic flux, generated by the inductor conductor, by leading out the lead wire between the conductor, being near the substrate, and the substrate.

In addition, the inductor element described above is suitable for use as a compound element that also has a capacitance component besides an inductance component. Since this inductor element has two conductors that are superimposed one on the other and its characteristics also include a capacitance component, this inductor element can be used in applications where an inductor and a capacitor are combined for making them a part of a circuit.

BRIEF DESCRIPTION OF THE DRAWINGS

FIG. 14 is a drawing showing the structure in the case of connecting a variable capacitance diode to the inner circumferential end of a lower layer of conductor;

FIG. 15 is a drawing showing the cross-sectional structure in the case of forming the variable capacitance diode, shown in FIG. 14, on a semiconductor substrate;

FIG. 16 is a diagram showing the structure in the case of connecting a variable resistor to the inner circumferential end of a lower layer of conductor;

FIG. 17 is a schematic diagram showing a modified example of the conductor included in the inductor element;

FIG. 18 is a schematic diagram showing a modified example of the conductor included in the inductor element;

FIG. 19 is a schematic diagram showing a modified example of the conductor included in the inductor element.

BEST MODE FOR CARRYING OUT THE INVENTION

Hereafter, an inductor element according to an embodiment where the present invention is applied will be specifically described with referring to drawings.

[First Embodiment]

Figure 1:
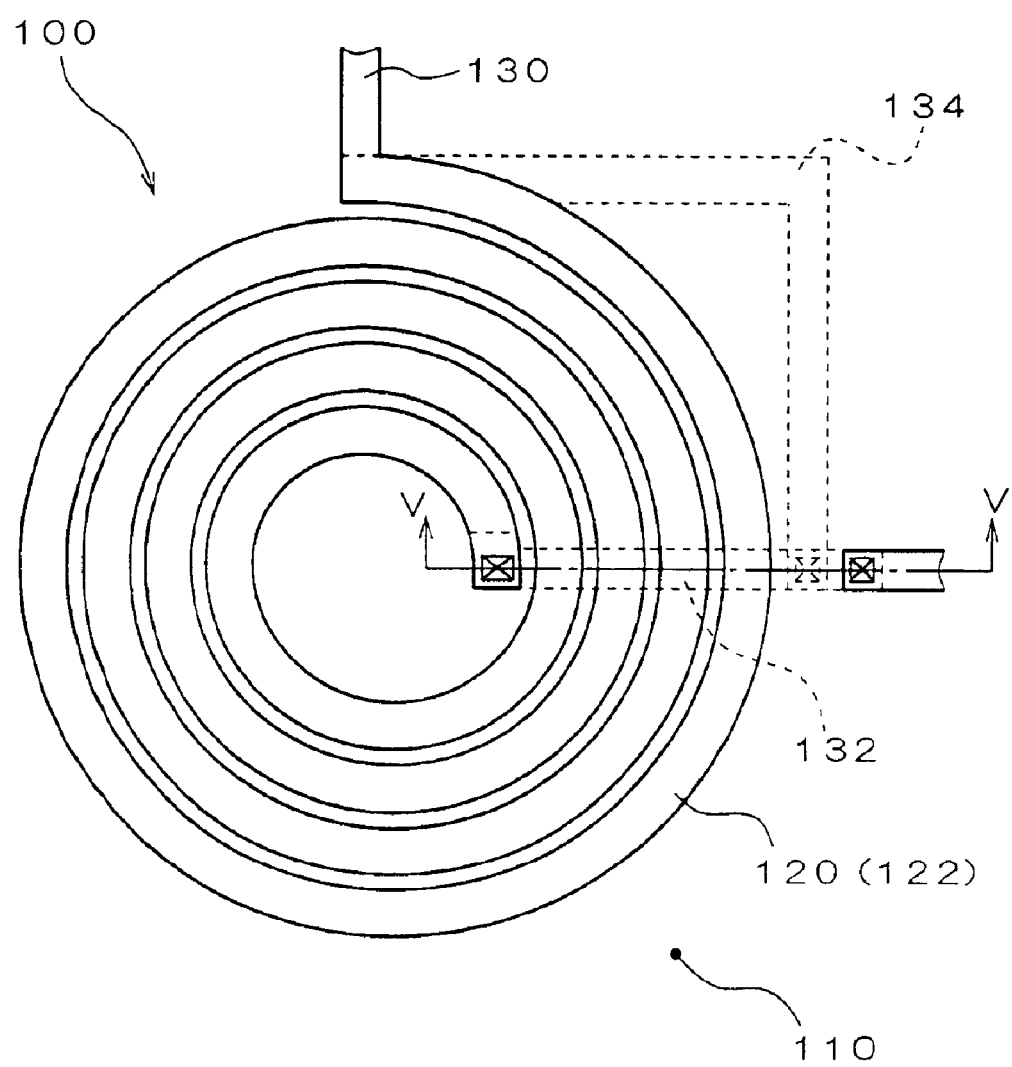
FIG. 1 is a schematic diagram showing a planar structure of an inductor element according to a first embodiment.
Figure 2:
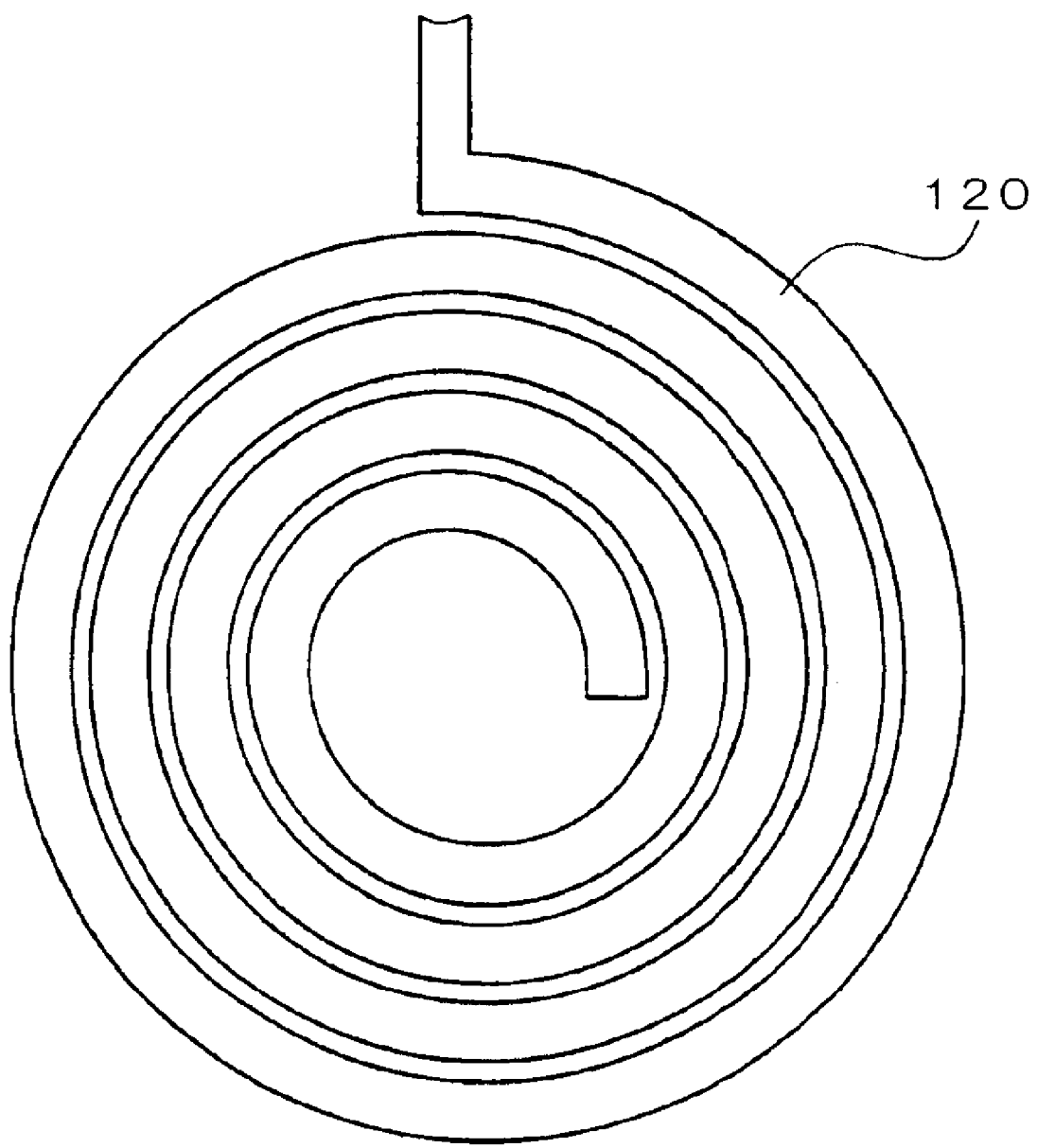
FIG. 2 is a drawing showing an upper layer of conductor included in the inductor element shown in FIG. 1.
Figure 3:
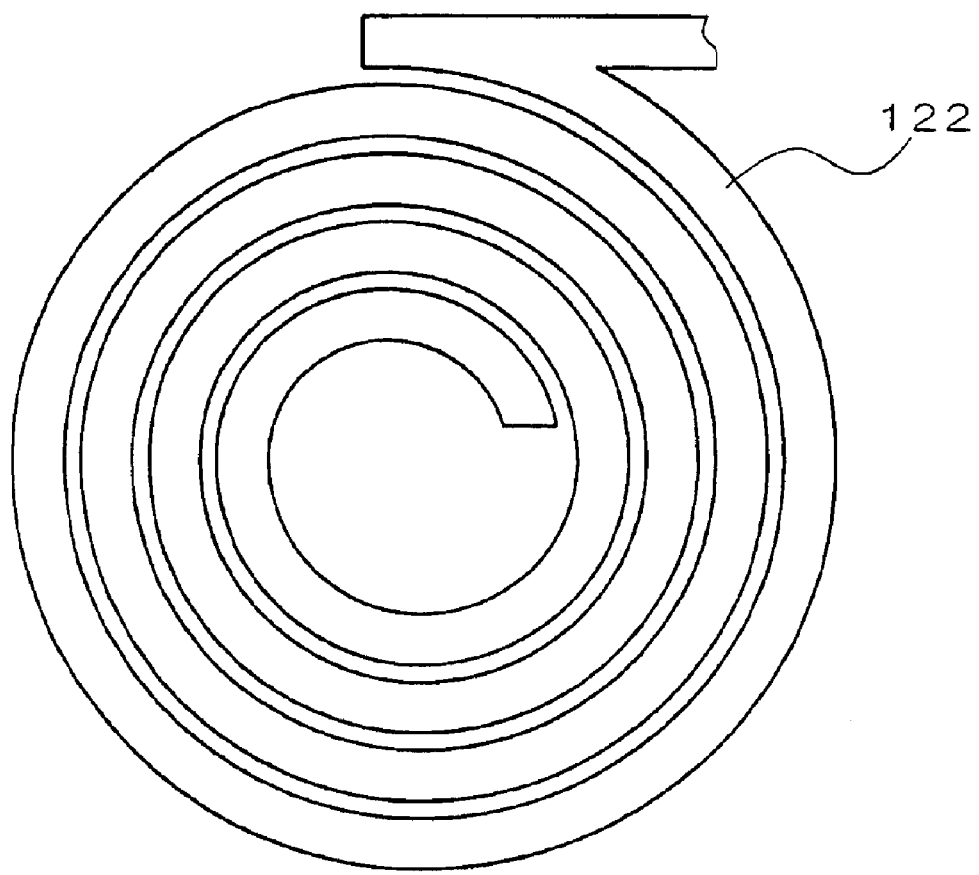
FIG. 3 is a drawing showing a shape of a lower layer of conductor included in the inductor element shown in FIG. 1.

FIG. 1 is a schematic diagram showing a planar structure of an inductor element according to the first embodiment. In addition, FIG. 2 is a drawing showing an upper layer of conductor included in the inductor element shown in FIG. 1. FIG. 3 is a drawing showing a shape of a lower layer of conductor included in the inductor element shown in FIG. 1.

An inductor element 100 according to this embodiment has two conductors 120 and 122 that have spiral shapes and are formed in the front side of a semiconductor substrate 110. These two conductors 120 and 122 have substantially the same shape. When viewed from the front side of the semiconductor substrate 110, they are formed so that the conductor 120, which becomes an upper layer, and another conductor 122, which becomes a lower layer, are formed by being superimposed one on the other substantially exactly. Each of the conductors 120 and 122 is formed of, for examples, a thin film of metal (metal layer), or semiconductor material such as poly silicon.

Figure 4:
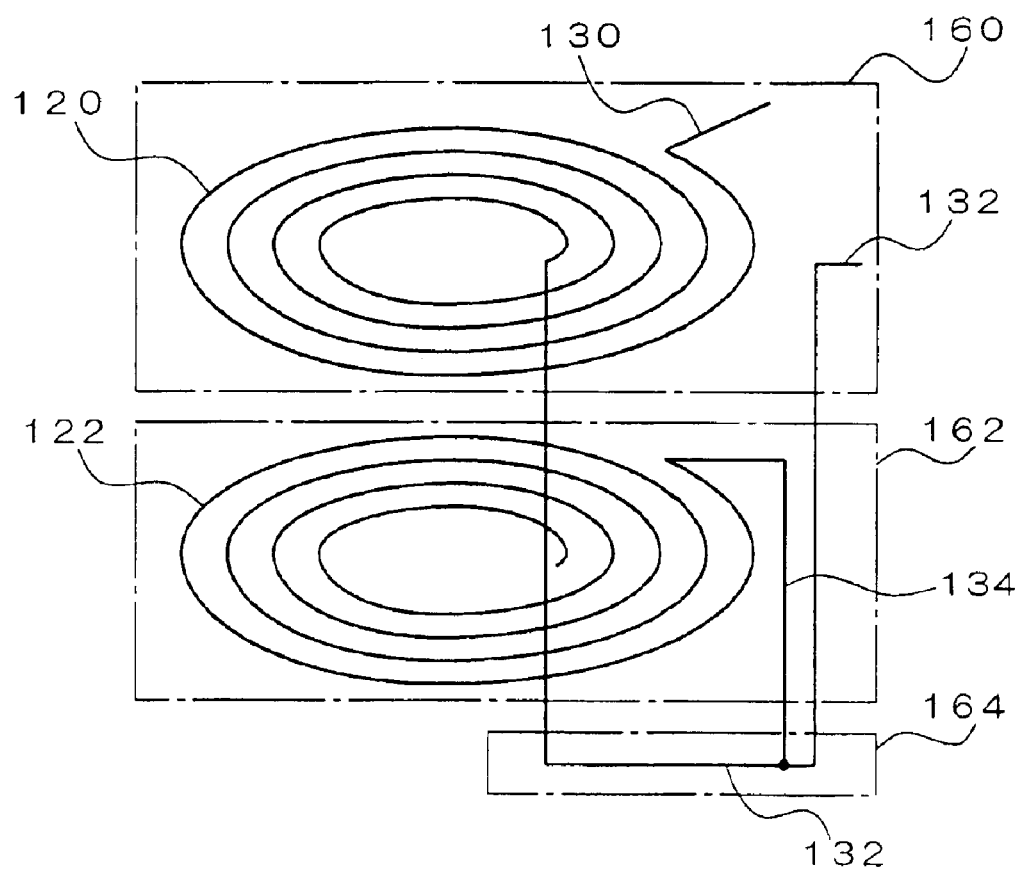
FIG. 4 is a drawing showing a connection state of two conductors included in an inductor conductor.

FIG. 4 is a schematic diagram showing a connection state of the two conductors 120 and 122, described above. As shown in FIG. 4, lead wires 130 and 132 are connected to an outer end (outer circumferential end) and an inner end (inner circumferential end) of the upper conductor 120 respectively, and the inner end of the upper conductor 120 and the outer end of the lower conductor 122 are connected with a connecting wire 134.

The upper conductor 120 functions as an inductor conductor, and is connected to a circuit (not shown) formed on the semiconductor substrate 110 through the lead wires 130 and 132 connected to ends thereof.

Figure 5:
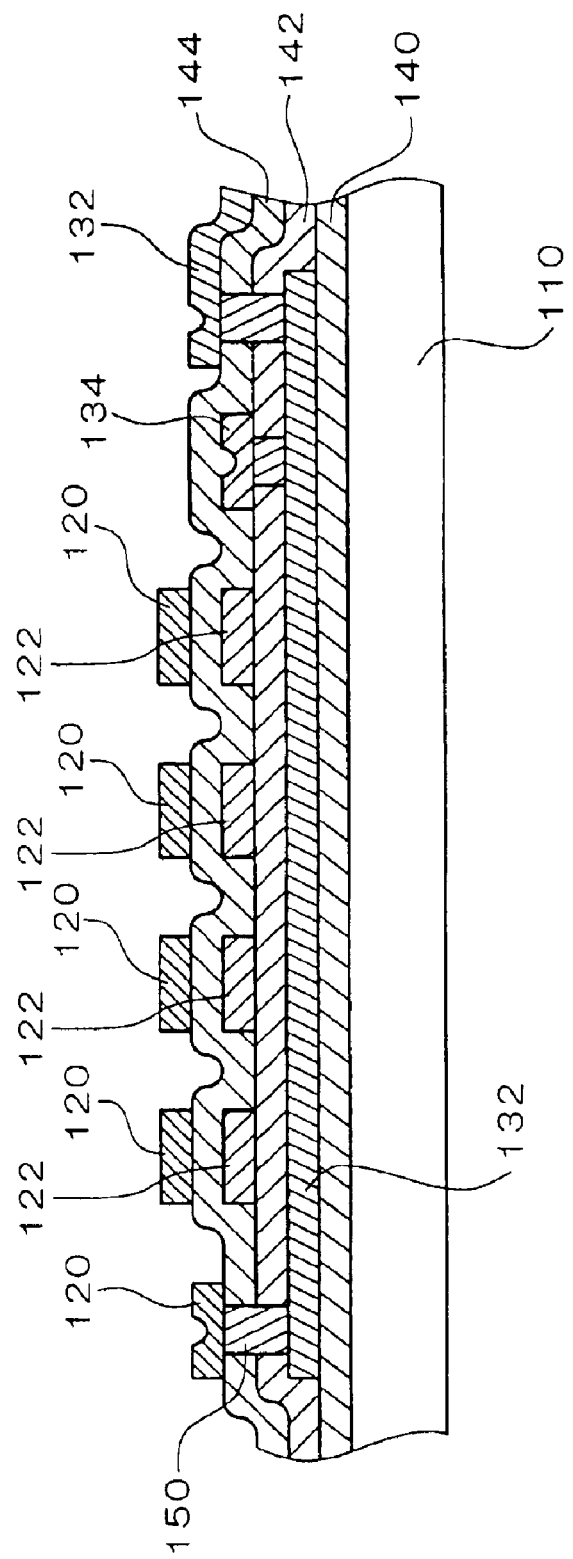
FIG. 5 is an enlarged sectional view taken on line V—V in FIG. 1.

FIG. 5 is an enlarged sectional view taken on line V—V in FIG. 1. As shown in FIGS. 4 and 5, at least three layers of metal layers 160, 162, and 164 are formed on the surface of the semiconductor substrate 110. One conductor 120 as an inductor conductor is formed with using a top layer of metal layer 160 that is most apart from the semiconductor substrate 110, and another conductor 122 is formed with using a middle layer of metal layer 162.

In addition, the lead wire 132 led out from the inner circumferential end of the top layer of conductor 120 is formed with using a bottom layer of metal layer 164 nearest to the semiconductor substrate 110. For example, as shown in FIG. 5, the inner circumferential end of the conductor 120 and one end of the lead wire 132 are connected through a through hole 150. The lead wire 132 formed from the bottom layer of metal layer 164 is led out outward so that the lead wire 132 may be orthogonal to each circumferential portion of the inductor conductor with spiral shape. In addition, insulating layers 140, 142, and 144 are formed between the conductors 120 and 122, and the lead wire 132, which are formed with using three metal layers 160, 162, and 164, and the semiconductor substrate 110 respectively, and mutual insulation is performed.

An inductor element 100 in this embodiment has the structure described above. Since predetermined inductance appears between the lead wires 130 and 132 connected to both ends of the upper layer of conductor 120 respectively, this upper conductor 120 can be used as an inductor conductor. In addition, under this upper conductor 120, the conductor 122 that has substantially the same shape as this conductor 120 is formed. It is possible to suppress the generation of eddy currents in the front side of the semiconductor substrate 110 when an upper conductor 120 is used as an inductor conductor, by connecting one end of the upper conductor 120 with one end of the lower conductor 122 with the connecting wire 134. Hence it is possible to make the upper conductor 120 effectively function as an inductor conductor.

Furthermore, in the inductor element 100 in this embodiment, the lead wire 132 led out from the inner circumferential end of the upper layer of conductor 120 serving as an inductor conductor is formed with using the bottom layer of metal layer 164, and is located with being most apart from the inductor conductor through the other conductor 122. Hence it is possible to suppress to the minimum interruption of flow of the effective magnetic flux generated by the inductor conductor, and to obtain good characteristics. In this manner, the inductor element 100 in this embodiment can be formed with using at least three layers of metal layers 160, 162, and 164 on the surface of the semiconductor substrate 110. Hence it becomes possible to realize forming the inductor element 100 with other parts in one piece to perform integration on the semiconductor substrate 110.

By the way, the present applicant performed various kinds of experiments about the effectiveness of an inductor element formed by locating the two conductors 120 and 122, described above, in piles on a substrate and mutually connecting both odd ends. Then, the present applicant has already applied for a patent on the basis of the experimental result (Japanese Patent Application No. H10-93869). The inductor element 100 in this embodiment is an advanced one, and is intended to improve characteristics by devising a leading-out position of the lead wire 132 with using that the two conductors 120 and 122 have two layer structure. For examples supposing that an inductor conductor with a spiral shape is simply formed on a semiconductor substrate or another substrate, even if a lead wire is formed with using an upper layer or a lower layer of metal layer which is adjacent to a metal layer in which this inductor conductor is formed, it is the same that the inductor layer and the lead wire are closely located. Hence the lead wire interrupts the effective magnetic flux generated by the inductor conductor. However, in the inductor element 100 in this embodiment, another conductor 122 is located between one conductor 120, serving as an inductor conductor, and the lead wire 132. Hence it is possible to reduce the turbulence of the effective magnetic flux at the time of leading out the lead wire 132 so that the lead wire 132 may intersect the inductor conductor 120.

Hereafter, the effectiveness of the inductor element in this embodiment will be described with reference to the experimental result shown in the application described above (Japanese Patent Application No. H10-93869).

Figure 6:
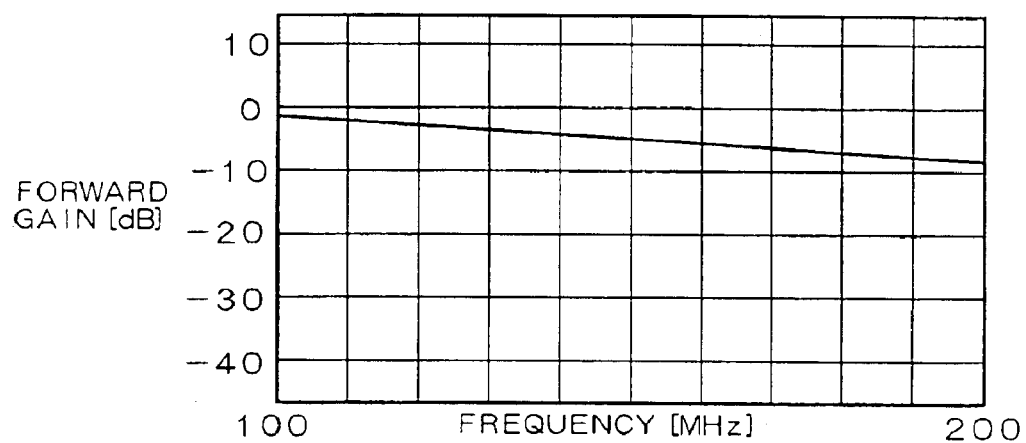
FIG. 6 is a graph showing experimental result.

FIG. 6 is a graph showing the measurement result of the forward gain of an inductor element which has an electrode of one layer having the same shape as the conductor 120 included in the inductor element 100. In addition, FIG. 7 shows a characteristic, which is the forward gain of an inductor element which has an electrode of one layer having the same shape as the conductor 120 included in the inductor element 100, at the time of closely contacting a conductor substrate to this inductor element.

As for the inductor element used in this measurement, a five-turn electrode having one-mm pattern width and a 0.2-mm adjacent gap of spiral pattern was formed on a front side of a 0.13-mm-thick insulating member with a dielectric constant of 3.17. The characteristic shown in FIG. 6 was measured with sufficiently separating this inductor element from other conductive members. The characteristic shown in FIG. 7 was measured with closely contacting a copper plate to a front side of the insulating member in an opposite electrode side of this inductor element. In addition, vertical axes in FIGS. 6 and 7 (this is the same also in FIGS. 8 and 9 which are described later) denote forward gain (attenuations) logarithmically expressed, and horizontal axes denote the frequencies of input signals logarithmically expressed, respectively.

In an inductor element which consists of one layer of electrode with a spiral shape, in a state that the inductor element is sufficiently separated from other conductive members, as shown in FIG. 6, as the frequency of an input signal becomes high, the forward gain becomes smaller. This is because the fact that the impedance of the inductor element having the predetermined inductance L is $j\omega L$ and becomes large in proportion to the frequency of the input signal.

Figure 7:
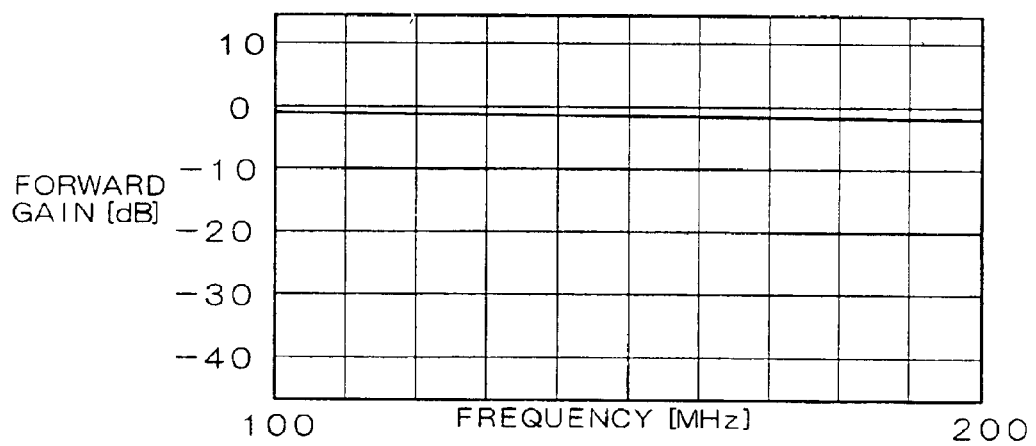
FIG. 7 is a graph showing experimental result.

On the other hand, as shown in FIG. 7, in the state that this inductor element is closely contacted to the copper plate, it is possible to maintain a high forward gain even if the input signal changes. This shows that this inductor element does not function as an original inductor since the inductance that this inductor element has becomes small by bringing the copper plate close to this inductor element. An estimated cause of decreasing the inductance is that eddy currents arise on the front side of the copper plate owing to magnetic flux, which is generated when a signal is inputted into the electrode, and cancel this magnetic flux.

In addition, in the measurement described above, although the copper plate was used as a substrate, even in the case that a semiconductor substrate is used instead of the copper plate, the same phenomenon happens fundamentally.

Figure 8:
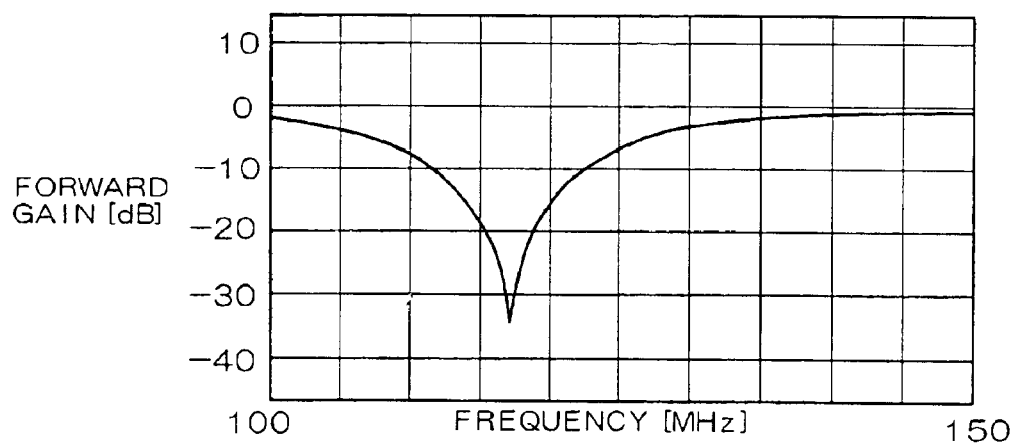
FIG. 8 is a graph showing experimental result.

FIG. 8 is a graph showing the measurement result of the forward gain of an inductor element having two layers of electrodes that have the same shape and arrangement as the two conductors 120 and 122 included in the inductor element 100. In addition, FIG. 9 shows the forward gain of an inductor element having two layers of electrodes that have the same shape and arrangement as the two conductors 120 and 122 included in the inductor element 100, at the time of closely contacting a copper plate to this inductor element.

The inductor element used for these measurements has the structure that an electrode corresponding to the conductor 122 shown in FIG. 1 is added to the inductor element shown in the measurement result in FIGS. 6 and 7. In addition, if closely contacting the copper plate to this inductor element, the lower electrode and copper plate are arranged through an adequate thin insulating member.

A resonance point appears at nearly 117 MHz as it is apparent from the forward gain characteristic shown in FIG. 8 in a state that the inductor element where two layers of electrodes which have spiral shapes is sufficiently separated from other conductive members. This is because this inductor element functions as a whole as a compound element that has an inductance component and a capacitance component since capacitance is produced between two electrodes while one electrode functions as an inductor conductor.

Figure 9:
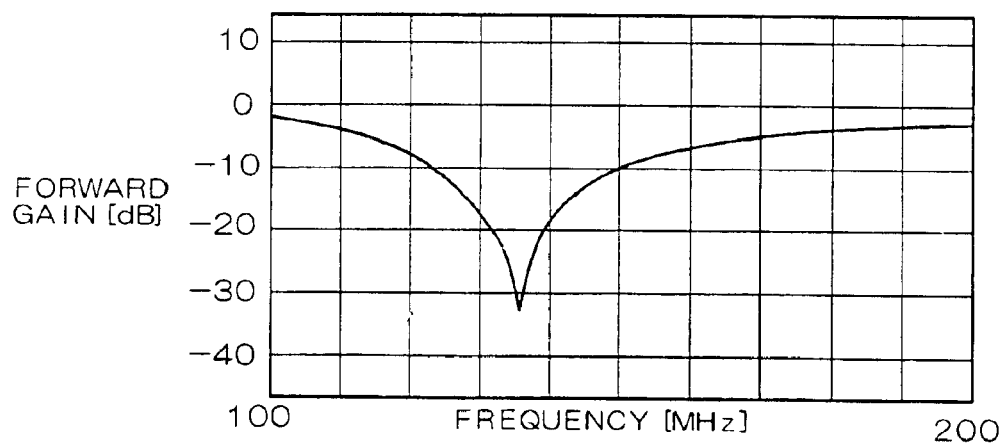
FIG. 9 is a graph showing experimental result.

In addition, in a state of closely contacting this inductor element to the copper plate, as shown in FIG. 9, a similar resonance point appears although the position of a resonance point (135 MHz) shifts. This shows that, by using the inductor element that has the double structure of the electrodes described above, even if the inductor element is closely contacting to the copper plate, the inductance component does not disappear and the function as an inductor conductor is maintained.

In addition, since the capacitance between two electrodes surely accompanies the inductor element that has double-structure electrodes, it is preferable to use it as one part of a circuit, where its resonance characteristic is used, as an application. For example, it is preferable to use it as an inductor element 100 in an oscillation circuit, a tuning circuit, or the like.

Next, a specific example at the time of using the inductor element 100 according to this embodiment described above as one part of an actual circuit will be described.

Figure 10:
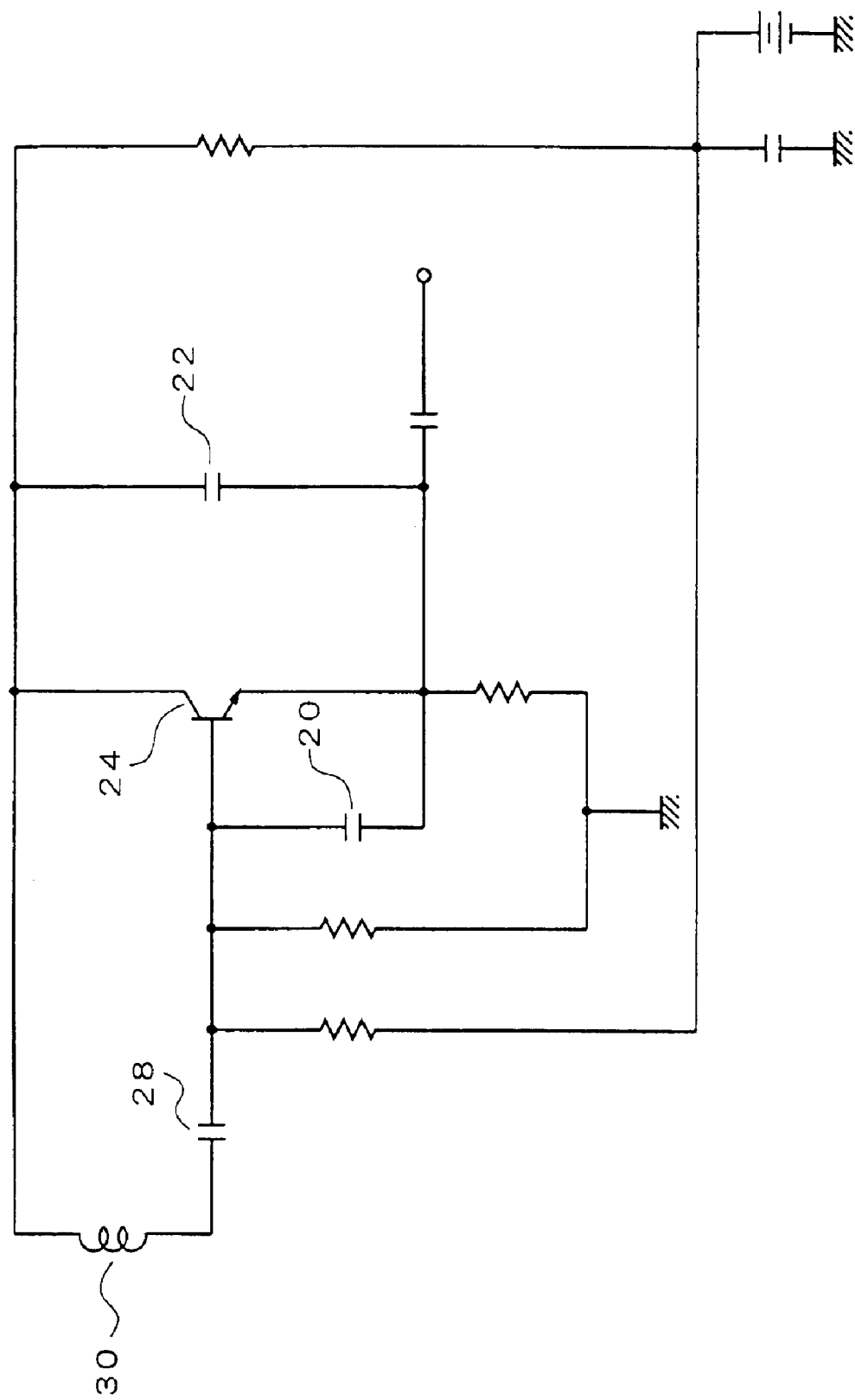
FIG. 10 is a circuit diagram of an oscillation circuit including an inductor element.

FIG. 10 shows the structure of a Clapp oscillator that is an example of an oscillation circuit constituted by using the inductor element 100 according to this embodiment. In this Clapp oscillator, the capacitance of two capacitors 20 and 22 may be several tens times the between-terminal capacity of a transistor 24. In addition, an inductor element 30 is connected through a capacitor 28.

Figure 11:
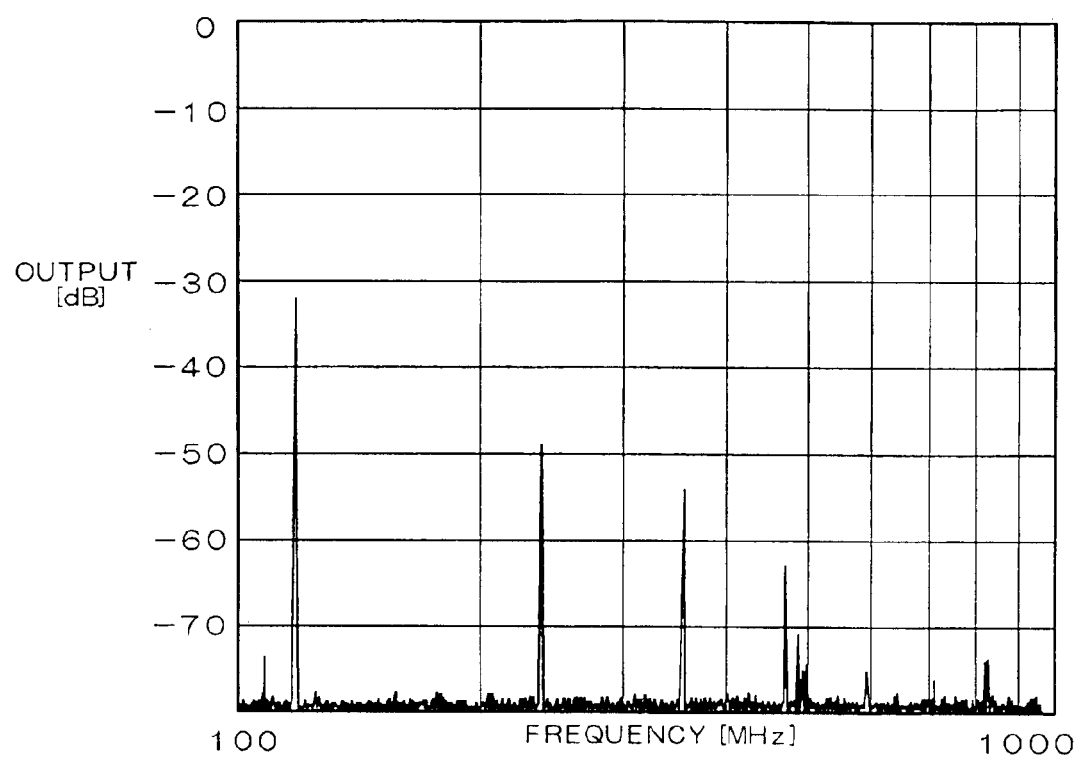
FIG. 11 is a chart showing an output characteristic of the oscillation circuit shown in FIG. 10.

FIG. 11 is a chart showing the output characteristic of an oscillation circuit where the inductor element, which has one layer of electrode and the result of the measurements of whose forward gain is shown in FIG. 6, is used as the inductor element 30 in the Clapp oscillator shown in FIG. 10. As shown in FIG. 11, an oscillation frequency of 119 MHz was observed.

Figure 12:
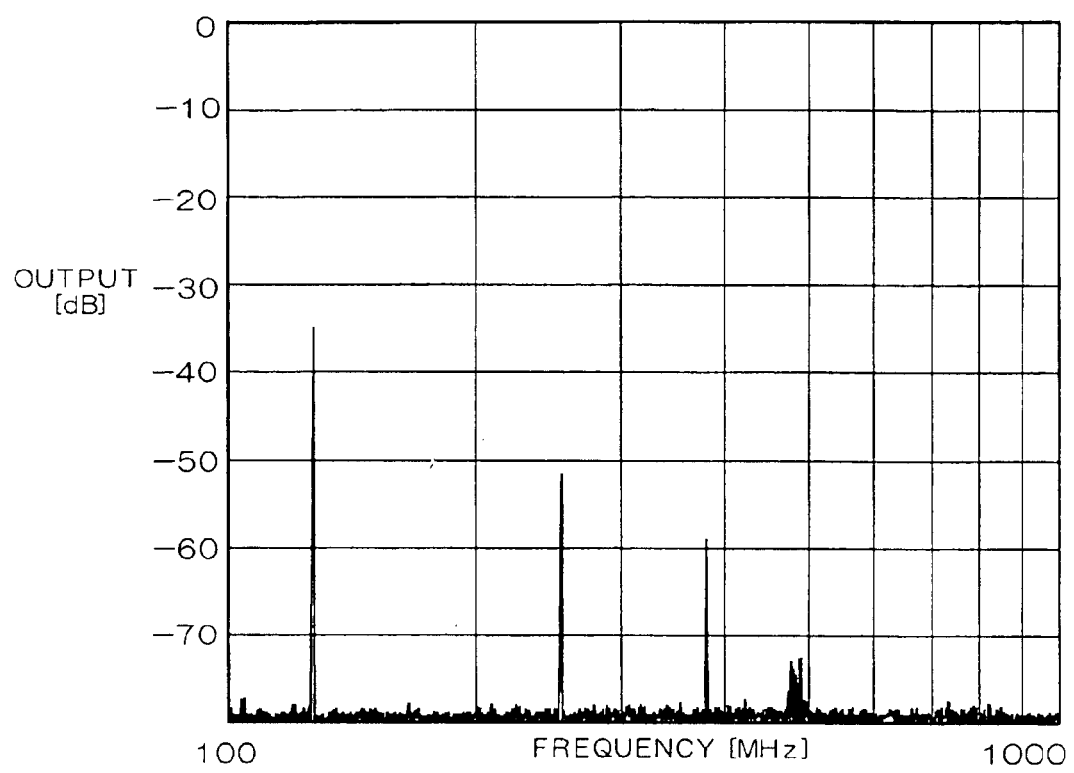
FIG. 12 is a chart showing an output characteristic of the oscillation circuit shown in FIG. 10.

In addition, FIG. 12 is a chart showing the output characteristic of an oscillation circuit where the inductor element, whose two-layer electrodes are closely contacted to the copper plate and the result of the measurements of whose forward gain is shown in FIG. 9, is used as the inductor element 30 in the Clapp oscillator shown in FIG. 10. As shown in FIG. 12, an oscillation frequency of 127 MHz is observed.

Thus, it can be seen that the inductor element having the two-layer electrodes functions as an inductor conductor without losing an inductance component even if it is closely contacted to the copper plate in its one side (the side opposite to the electrode used as the inductor conductor). Hence, the inductor element 100 according to this embodiment which has the fundamentally same structure can effectively function as an inductor element which has predetermined inductance even if it is formed so that it may be closely contacted to the front side of the semiconductor substrate 110 by providing the lower conductor 122 besides the upper conductor 120.

[Second Embodiment]

Figure 13:
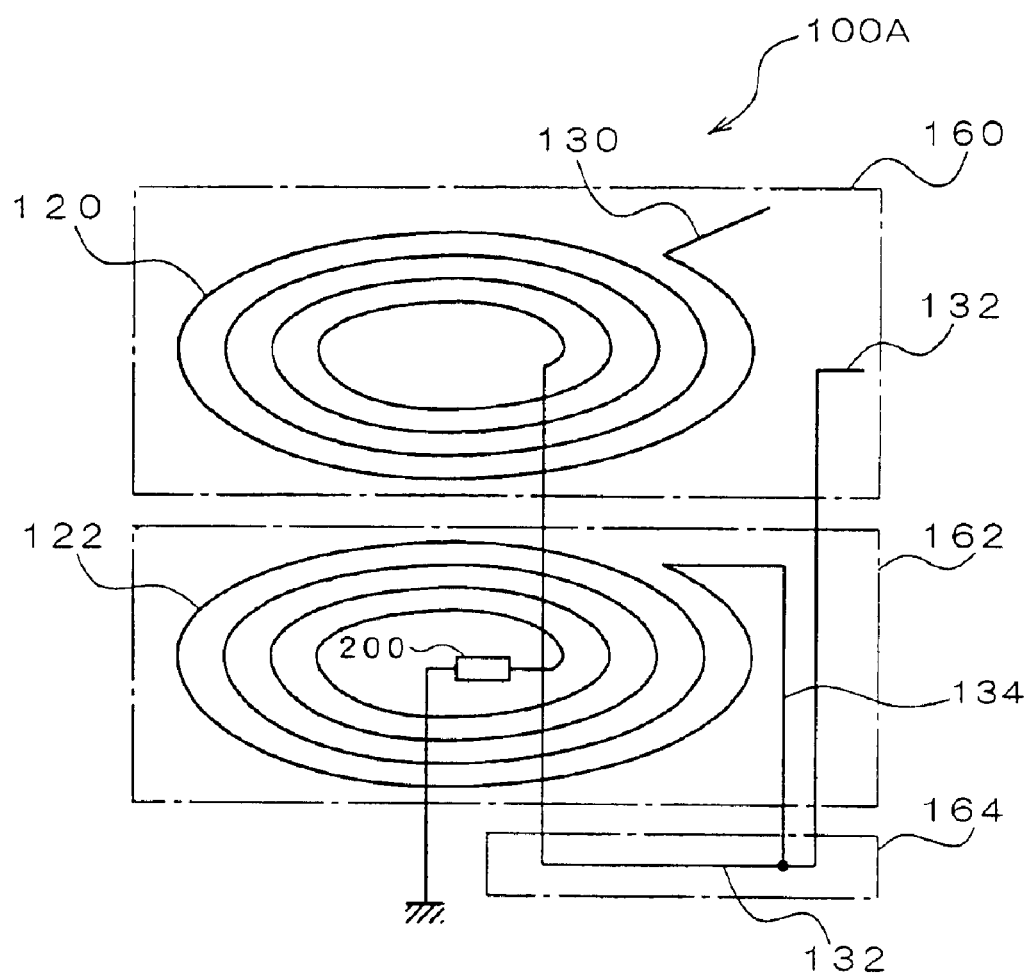
FIG. 13 is a schematic diagram showing a structure of an inductor element according to a second embodiment.

FIG. 13 is a diagram showing the structure of an inductor element 100A in a second embodiment. This is different in that a predetermined impedance element 200 is added to the inductor element 100 in the first embodiment shown in FIG. 4.

Namely, in the inductor element 100 in the first embodiment described above, with paying attention to the other conductor 122 located so as to substantially superimpose the one conductor 120 serving as an inductor conductor, only one end (the outer circumferential end in the example shown in FIG. 1) is connected to the connecting wire 134 and the inner circumferential end is free (open state). In this embodiment, the characteristics of the whole inductor element 100A can be improved or adjusted by terminating the inner circumferential end of the conductor 122 with the impedance element 200.

For example, when electric current flows into the one conductor 120 of the inductor element 100A, induced current flows to or electric current directly flows through the connecting wire 134 into the other conductor 122. However, it becomes possible to prevent unnecessary reflection in this inner circumferential end by terminating the inner circumferential end of the other conductor 122 through the impedance element 200. In addition, it becomes easy to improve or change the frequency characteristic of a circuit including the inductor element 100A by adjusting or changing a device constant of the impedance element 200. For example, what is necessary to make a frequency low is just to use an inductor as the impedance element 200. On the contrary, what is necessary to make a frequency high is just to use a capacitor as the impedance element 200. Alternatively, the impedance element 200 can be formed with arbitrarily combining these, that is, an inductor, a capacitor, and a resistor.

In addition, a chip part of an inductor, a capacitor or a resistor can be most easily used for the impedance element 200 described above. In addition, in consideration of forming two conductors 120 and 122, and the like, which constitute the inductor element 100A, on the semiconductor substrate 110 as shown by the cross-sectional structure in FIG. 5, it is desirable also to form the impedance element 200 on the semiconductor substrate 110 with using semiconductor manufacturing technology. For example, what is conceivable is to form a resistor with using a highly resistive material, to form a capacitor with making two layers of metal layers, having predetermined areas, face each other, or to form an inductor with using conductors having predetermined shapes. In addition, since the impedance element 200 is used as an element for termination, not-so-high Q is required even if this is realized with an inductor. For this reason, it also becomes possible to use an inductor constituted by forming a conductor with a predetermined shape (for example, a spiral shape) on the semiconductor substrate 110 as the impedance element 200.

In addition, it is also good to use the impedance element 200 whose device constant can be changed by external control means. FIG. 14 is a diagram showing the structure in the case of connecting a variable capacitance diode 210 to the inner circumferential end of the conductor 122. The variable capacitance diode 210 operates as a capacitor with predetermined capacitance by using it in a reverse biased state, whose capacitance is changed by changing a reverse bias voltage. This variable capacitance diode 210 is connected to the inner circumferential end of the conductor 122 through a capacitor 212 for DC component removal.

FIG. 15 is a drawing showing the cross-sectional structure in the case of forming the variable capacitance diode 210, shown in FIG. 14, on the semiconductor substrate 110. As shown in FIG. 15, a p+ region 220 formed near the surface of the semiconductor substrate 110 formed of an n type silicon substrate (n-Si substrate) and an n+ region 222 further formed in a part thereof are included, and these p+ regions 220 and n+ region 222 form a pn junction layer. In addition, an electrode 230 for grounding is formed on the surface of the p+ region 220, and an electrode 232 for applying an variable reverse bias voltage as a control voltage Vc is formed on the surface of the n+ region 222. By applying the positive control voltage Vc to the electrode 232, the variable capacitance diode 210 whose capacitance changes according to the amplitude of this control voltage Vc can be formed.

FIG. 16 is a diagram showing the structure in the case of connecting a variable resistor, formed of an FET 240, to the inner circumferential end of the conductor 122. As shown in FIG. 16, the variable resistance is easily realizable by using a channel of the FET 240 as a resistor. By changing the control voltage Vc applied to a gate electrode, the resistance of the channel formed between a source and a drain can be changed. In addition, the FET 240 can be easily formed on the semiconductor substrate 110 by forming a source region and a drain region near the surface of the semiconductor substrate 110, and forming electrodes with predetermined shapes near regions in which the source region and the drain region and channels therebetween are formed.

Thus, it is possible to change termination conditions by terminating one end of the conductor 122 with using an impedance element whose device constant can be changed according to the control voltage Vc applied from the external. Hence, even if a frequency of a signal inputted into or outputted from the inductor element 100A is changed, it is possible to adjust the termination conditions according to the change, and hence, to improve characteristics.

The present invention is not limited to the above-described embodiments, but various types of modifications are possible within the scope of the gist of the present invention. For example, in the inductor element 100 shown in FIG. 1, the inner end of the upper conductor 120 and the outer end of the lower conductor 122 are connected through the connecting wire 134. Nevertheless, on the contrary, it can be also performed to mutually connect the outer end of the upper conductor 120 and the inner end of the lower conductor 122. In addition, it can be also performed to connect either outer ends or both inner ends of conductors 120 and 122 when it is allowed that the inductance of an inductor element becomes small to some extent.

In addition, since two conductors 120 and 122 included in the inductor elements 100 and 100A are formed in spiral shapes in the embodiments described above, it is possible to realize the inductor elements 100 and 100A having large inductance. Nevertheless, it is also good to form two conductors 120 and 122 in meander shapes (FIG. 17). In addition, the inductance of these inductor elements 100 and 100A can be small when it is used as one part of a high frequency circuit. Hence it is also good to form the conductors 120 and 122 less than one turn by reducing the numbers of turns (FIG. 18), or to form it in a substantially linear shape (FIG. 19).

In addition, although the shapes of two conductors 120 and 122 are set substantially similarly in the embodiments described above, it is also good to set them in different shapes. For example, it can be also performed to set the number of turns of the lower conductor 122 to be more than that of the upper conductors 120. Thus, since the upper conductor 120 does not directly face the semiconductor substrate 110 if all or some of the lower conductor 122 is arranged under the upper conductor 120, it is possible to effectively prevent the generation of eddy currents due to the upper conductor 120.

In addition, although the inductor elements 100 and 100A are formed by forming two conductors 120 and 122 on the semiconductor substrate 110 in the embodiments described above, the inductor element in which two conductors 120 and 122 are formed on a conductor substrate such as a metal is also realizable. From the experimental result shown in FIG. 9, it is confirmed that, even in this case, this effectively functions as the inductor element. If it becomes possible to form the inductor elements 100 and 100A by closely contacting it on a conductor substrate, it also becomes possible to arrange the inductor elements 100 and 100A on a front side of a metal shielding case or the like. Hence it becomes easy to secure an installation space of the inductor element.

Figure 20:
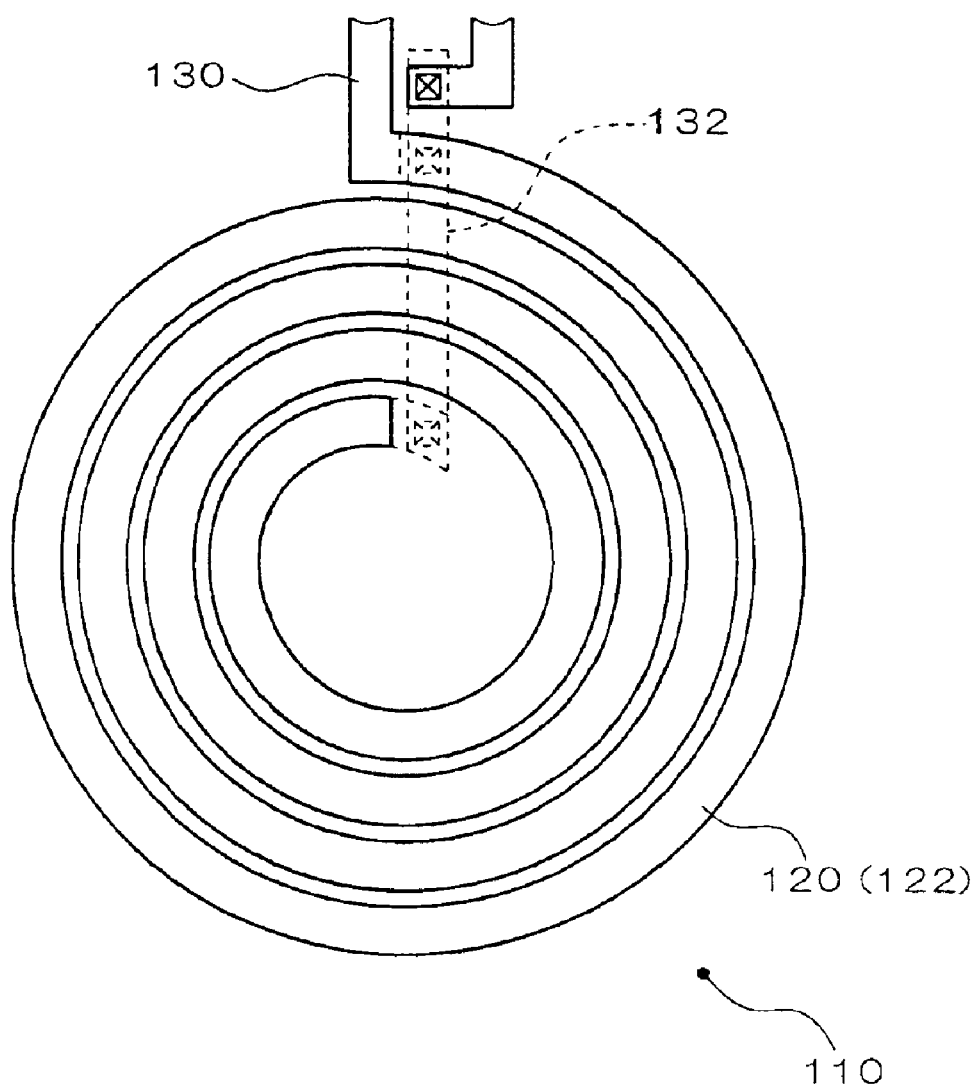
FIG. 20 is a drawing showing a modified example of the inductor element, the drawing where a connecting wire that connects ends of two conductors is omitted.

In addition, in the inductor elements 100 and 100A in respective embodiments described above, each connecting wire 134 different from the lead wires 130 and 132 is used for mutually connecting both odd ends of the two conductors 120 and 122. Nevertheless, as shown in FIG. 20, it is also good to mutually connect both odd ends of the two conductors 120 and 122 with using a part of one lead wire 132. In this case, the connecting wire 134 becomes unnecessary. Hence it becomes possible to simplify structure, and further, to improve characteristics since it is prevented that unnecessary magnetic flux by the connecting wire 134 is generated, and that effective magnetic flux generated by the inductor conductor is disturbed.

INDUSTRIAL APPLICABILITY

As described above, according to the present invention, a conductor that is one of two conductors, both odd ends of which are mutually connected, and is apart from a substrate is used as an inductor conductor, and a lead wire of this inductor conductor passes between another conductor, being near to the substrate, and the substrate. Hence it is possible to suppress to the minimum the interruption of the flow of effective magnetic flux generated by the inductor conductor, and hence good characteristics can be obtained.

In addition, according to the present invention, electric current flows also to another conductor by effective magnetic flux generated by the inductor conductor. Nevertheless, by terminating the free end of this other conductor by an impedance element, it becomes possible to prevent unnecessary reflection in this portion, and hence, to improve characteristics.

What is claimed is:

1. An inductor element comprising two conductors, characterized in that the two conductors having corresponding shape are formed in piles on a substrate, the two conductors being insulated one from the other and are connected with each other at one opposite end, wherein one conductor being apart from the substrate is used as an inductor conductor, the other conductor being interposed between the inductor conductor and the substrate, and a conductive lead wire of the inductor conductor extending between the other conductor, and the substrate, the other conductor having an unconnected end.

2. The inductor element according to claim 1, characterized in that three or more metal layers are formed on the substrate, and the two conductors and the lead wire are formed respectively by patterning the metal layers, the metal layers having other layers respectively therebetween.

3. The inductor element according to claim 1, characterized in that the two conductors are connected at opposite ends with the lead wire.

4. The inductor element according to claim 1, characterized in that the two conductors have substantially the same shape.

5. The inductor element according to claim 1, characterized in that the two conductors have long shapes, and one end of one conductor in a longitudinal direction is connected with one end of the other in the longitudinal direction.

6. The inductor element according to claim 1, characterized in that the two conductors have circular shapes less than one turn, and one end of one conductor is connected with one end of the other conductor.

7. The inductor element according to claim 1, characterized in that the two conductors have spiral shapes each number of turns of which is one or more, and one end of one conductor is connected with one end of the other conductor.

8. The inductor element according to claim 1, characterized in that the two conductors each have a spiral shape having one or more turns, opposite ends are mutually connected, and also, the lead wire led from the inner circumferential end of the inductor conductor is made to pass between the other conductor and the substrate.

9. The inductor element according to claim 1, characterized in that the two conductors are formed in substantially linear shapes, and one end of one conductor is connected with one end of the other conductor.

10. The inductor element according to claim 1, characterized in that the two conductors are formed in meander shapes, and one end of one conductor is connected with one end of the other conductor.

11. The inductor element according to claim 7, characterized in that an inner end of the one conductor is connected with an outer end of the other conductor.

12. The inductor element according to claim 1, characterized by further comprising:

an inductance component of the inductor element; and a capacitance component between the two conductors.

13. An inductor element comprising two conductors, characterized in that the two conductors having corresponding shape are formed in piles on a substrate the two conductors are insulated one from the other, and are connected with each other at one opposite end, wherein one conductor apart from the substrate is used as an inductor conductor, and further, an end of the other conductor not connected to the inductor conductor is terminated with a predetermined variable impedance element so that it is possible to change at least one device constant of resistance, capacitance or inductance in the impedance element, and termination conditions are changed by changing the device constant.

14. The inductor element according to claim 13, characterized in that the substrate is a semiconductor substrate, and the variable impedance comprises a capacitor that is formed of a variable capacitance diode made of a semiconductor layer formed in the inside or outside of the semiconductor substrate.

15. The inductor element according to claim 13, characterized in that the substrate is a semiconductor substrate, and the variable impedance comprises a resistor that is formed of a channel of an FET made of a semiconductor layer formed in the inside or outside of the semiconductor substrate.

16. The inductor element according to claim 13, characterized in that the two conductors have substantially the same shape.

17. The inductor element according to claim 13, characterized in that the two conductors have long shapes, and one end of one conductor in a longitudinal direction is connected with one end of the other in the longitudinal direction.

18. The inductor element according to claim 13, characterized in that the two conductors have circular shapes less than one turn, and one end of one conductor is connected with one end of the other.

19. The inductor element according to claim 13, characterized in that the two conductors have spiral shapes each number of turns of which is one or more, and one end of one conductor is connected with one end of the other.

20. The inductor element according to claim 13, characterized in that the two conductors are formed in substantially linear shapes, and one end of one conductor is connected with one end of the other.

21. The inductor element according to claim 13, characterized in that the two conductors are formed in meander shapes, and one end of one conductor is connected with one end of the other.

22. The inductor element according to claim 19, characterized in that an inner end of the one conductor is connected with an outer end of the other conductor.

23. The conductor element according to claim 13, characterized by further comprising:

an inductance component of the inductor element; and a capacitance component between the two conductors.

24. An inductor comprising: a pair of conductors, the first conductor having a first and second termination and a middle portion between said first and second termination, said middle portion functioning as an inductor conductor, a second conductor below the first conductor being substantially the same shape as said first conductor, said second conductor connected to said first conductor at one end thereof, said first conductor having a lead portion between one of said first and said second terminations and said middle portion, said lead portion and said second conductor and said first conductor being respectively stacked in a stacked arrangement on a substrate with said lead portion being between said substrate and said second conductor, each of said lead portion and said second conductor and first conductor being insulated from each other.

25. An inductor according to claim 24 wherein said second conductor has a second end being connected to one of a variable capacitance diode and a FET.

* * * * *